June 20, 1967 R. F. KEANE 3,327,134

TRANSISTORIZED DELAY GATE GENERATOR

Filed July 11, 1963

INVENTOR.
ROBERT F. KEANE

BY Ernest F. Weinberger
Max D. Sirmis
ATTORNEYS

United States Patent Office 3,327,134

Patented June 20, 1967

3,327,134

TRANSISTORIZED DELAY GATE GENERATOR

Robert F. Keane, Syracuse, N.Y., assignor, by mesne assignments, to the United States of America as represented by the Secretary of the Navy Filed July 11, 1963, Ser. No. 294,459
1 Claim. (Cl. 307—88.5)

This invention in general relates to gate generators and in particular to stable, variable time delay gate generators.

Present delay gate generators although satisfactory for some uses are still limited in certain respects. The time duration, duty cycle and stability of the delay are inherent drawbacks in that it is necessary that both the rise and fall times be steep and fast. These operating characteristics are essential to improved circuitry in frequency dividers, F.M. discriminators, frequency analyzers, computer and logic circuits. In addition, it is desirable to extend the range of delay without the substitution, within the circuit, of different components.

An object of this invention is to provide an inexpensive, simple, reliable, stable, accurate transistorized delay gate generator.

Another object is to provide a delay gate generator having an accurate delay range of approximately 500 to 1 without the substitution of components and without any adverse affects on rise and fall time.

A still further object of this invention is to provide delay gate generator wherein the gate period is approximately independent of triggering rate and duty cycle.

Other objects and advantages will appear from the following description of an example of the invention and the novel features will be particularly pointed out in the appended claims.

Figure 2:
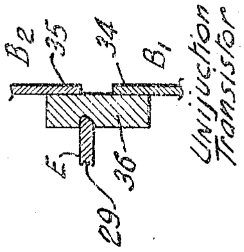
Figure 1:
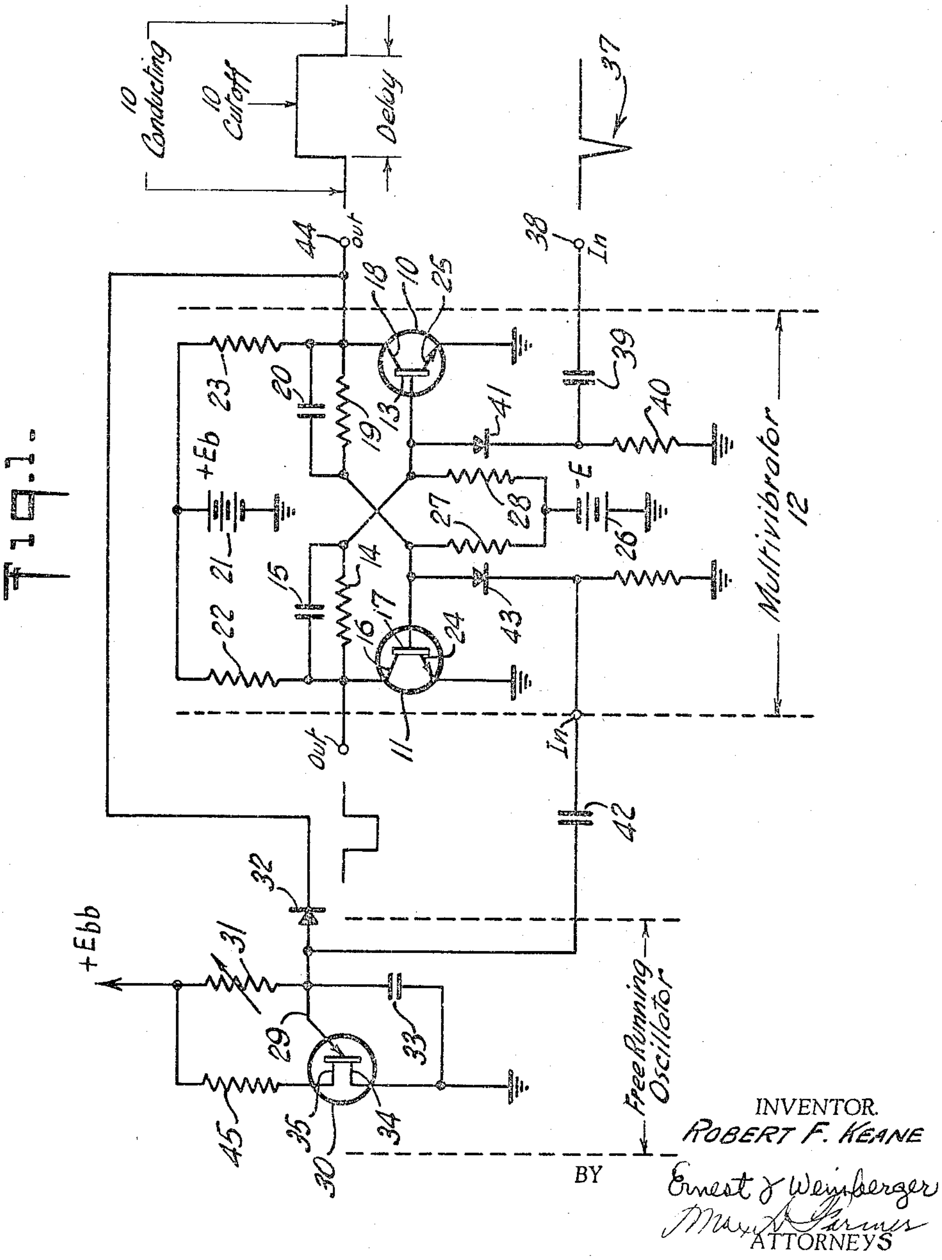

In the accompanying drawing:

FIG. 1 is a schematic diagram of an embodiment made in accordance with the principle of this invention, and FIG. 2 is a sectional view of a unijunction transistor which may be employed in conjunction with this invention.

In the illustrated embodiment of the invention (FIG. 1) a pair of transistors 10 and 11 are arranged to form a bistable multivibrator 12 of the basic Eccles-Jordan type although other varieties could also be employed. The transistors as shown are NPN type and if PNP are used the polarities need only be reversed. The base element 13 of transistor 10 is coupled by way of parallel resistor 14 and capacitor 15 to the collector 16 of transistor 11, while similarly base 17 of transistor 11 is coupled to collector 18 transistor 10 by resistor 19 and capacitor 20. A positive collector voltage $E_b$ is applied by battery 21 or any other D.C. source, through resistors 22 and 23 while the emitters 24 and 25 are grounded. The base bias is supplied by battery 26 through resistors 27 and 28 and is some negative potential ($-E$).

Due to component differences, when the application of D.C. energy to the circuit occurs, one of the transistors will conduct and one will be held in the non-conducting state. Assuming that initially transistor 10 is conducting and is saturated, then the collector 18 is clamped to approximately ground potential through grounded emitter 25. The emitter 29 of unijunction transistor 30 is clamped to the same potential since current from source $+E_{bb}$ flows through variable resistor 31, diode 32 collector 18 and grounded emitter 25. The potential across charging condenser 33 is thereby maintained constant and low enough to prevent unijunction transistor 30 from firing.

FIG. 2 illustrates the construction of a typical unijunction transistor which is a three-terminal semiconductor device whose electrical characteristics are very different from those of the conventional two-junction transistor. Its most useful features are: (a) a stable firing voltage which is a fixed fraction of the applied interbase voltage, (b) a very low value of firing current, (c) a negative resistance curve which is uniform from unit to unit and stable with temperature and life (d) high pulse current capability. Two ohmic contacts base-one 34 and base-two 35 are made at opposite ends of a small *n*-type silicon bar 36. A rectifying contact emitter 29 is made on the opposite side off the bar close to base 35. There exists an interbase resistance ranging approximately from 5K to 10K between bases 34 and 35. Under normal circuit use base-one 34 is grounded while a positive bias voltage is applied to the other base 35. In the absence of emitter current the bar 36 acts like a simple voltage divider and some small voltage will appear at the emitter 29 and the emitter is reverse-biased. Any larger emitter voltage, however, forward-biases the emitter and emitter current will flow. The net result is a decrease in the resistance between the emitter 29 and base 34 so that as the emitter current increases, the emitter voltage decreases and a negative resistance characteristic is obtained.

The voltage coupled from collector 18 to emitter 29 is insufficient to fire transistor 30 as long as transistor 10 is conducting. Now, a negative trigger pulse 37 is applied to input terminal 38 which in turn is capacitively coupled to the base 13 of transistor 10 by capacitor 39 and across resistor 40 with diode 41 arranged in series to prevent pulses of positive potential from being applied thereto. The delay cycle is initiated by this negative pulse which now reduces the positive bias at base 13 which is coupled from collector 16 and causes transistor 10 to be cut off. At the same time collector 18 rises to the source voltage $+E_{bb}$ which is coupled to base 17 of transistor 11 and forces this transistor to conduct while holding transistor 10 cut off. In other words, the negative input pulse resulted in a change of state (conducting-nonconducting) of each of the transistors. With the application of $+E_{bb}$ from collector 18 to diode 31, the diode is reversed biased and the charging capacitor 33 starts to charge up from $+E_{bb}$ due to the fact that current cannot flow through resistor 31 and transistor 10. The rate at which condenser 33 charges is determined by the source voltage $E_{bb}$ and the values of resistor 31 and the condenser 33. As the condenser charges the potential at emitter 29 rises and when it reaches the peak point emitter voltage the injunction transistor 30 fires and the charging condenser is very rapidly discharged through base 34 due to the lowering of base-emitter resistance.

The negative going pulse developed at emitter 29 due to the rapid discharge is capacitively coupled through capacitor 42 to base 17 of transistor 11 with diode 43 interposed therebetween for correct polarity. Just as the initial negative trigger pulse reversed the state of the transistors so will this feedback negative waveform from emitter 29, thereby reseting the bistable multivibrator 12 back to its original state. As the multivibrator is reset the potential at collector 18 drops to the potential across the condenser 33 (valley voltage of the unijunction transistor) within fractions of a microsecond. The discharge is completed through diode 32, which is now forward biased, and transistor 10.

The output of the delay gate may be obtained from the collector of either transistor, as for example, terminal 44 where the output is illustrated with the delay indicated thereon. Summarizing, the invention contemplates the combination of two unique circuits, namely, a bistable multivibrator and a free running unijunction oscillator. These circuits are coupled through an asymmetrical conducting device or clamping diode and a feedback loop from the unijunction oscillator to the bistable multivibrator. Since the charging condenser is completely discharged at the end of each cycle the gate delay or period is independent of the triggering rate and duty cycle. The duty cycle may be varied from approximately zero to 99 percent with less than one-half percent change in period output. Of note is the fact that conventional monostable circuits cannot achieve better than 5 percent timing accuracies when the duty cycle approaches 60 percent. Due to the fact that the unijunction oscillator circuit can be readily temperature compensated by the proper selection of the resistance of the base-two 35 leg (resistor 45), timing accuracies of the order of one percent are attainable up to 100° C.

It will be understood that various changes in the details, materials and arrangements of parts (and steps) which have been herein described and illustrated in order to explain the nature of the invention may be made by those skilled in the art within the principle and scope of the invention as expressed in the appended claim.

I claim:

In a delay gate generator which comprises:

(a) a transistorized bistable multivibrator having a pair of transistors whose emitter terminals are grounded and each also having base and collector elements, said base terminals connected to ground through a diode and a resistor, (b) a capacitor, (c) a source of direct current in series with a variable resistor for charging said capacitor at a selected rate, (d) a unijunction transistor having a pair of base elements and an emitter element with said emitter element and one of said base elements connected across said capacitor for rapidly discharging said capacitor after it has attained a selected charge thereacross, (e) a diode rectifier (f) a first electrical path having connected therein said capacitor, said asymmetrical element and said collector element of one of said transistors, the improvement of coupling means electrically coupling the junction between said capacitor and said diode rectifier with the junction formed by the said diode and resistor of the other of said transistors, a second resistor connected between the other of said base elements and said source, whereby when an input trigger is applied to said diode-resistor junction of said one transistor, said multivibrator will switch from a first state to a second state in which said capacitor is charged and after attaining a pre-selected charge said switch will discharge said capacitor and said discharge by way of said coupling means will return said multivibrator to said first state.

References Cited

UNITED STATES PATENTS 2,997,665 8/1961 Sylvan ------------ 307—88.5

ARTHUR GAUSS, *Primary Examiner.*

J. BUSCH, *Assistant Examiner.*